United States Patent
Adam et al.

(10) Patent No.: US 8,361,859 B2
(45) Date of Patent: Jan. 29, 2013

(54) STRESSED TRANSISTOR WITH IMPROVED METASTABILITY

(75) Inventors: Thomas N. Adam, Slingerlands, NY (US); Stephen W. Bedell, Wappingers Falls, NY (US); Abhishek Dube, Fishkill, NY (US); Eric C. T. Harley, Lagrangeville, NY (US); Judson R. Holt, Wappingers Falls, NY (US); Alexander Reznicek, Mount Kisco, NY (US); Devendra K. Sadana, Pleasantville, NY (US); Dominic J. Schepis, Wappingers Falls, NY (US); Matthew W. Stoker, Poughkeepsie, NY (US); Keith H. Tabakman, Fishkill, NY (US)

(73) Assignee: International Business Machines Corporation, Armonk, NY (US)

(*) Notice: Subject to any disclaimer, the term of this patent is extended or adjusted under 35 U.S.C. 154(b) by 56 days.

(21) Appl. No.: 12/942,289

(22) Filed: Nov. 9, 2010

(65) Prior Publication Data

US 2012/0112208 A1 May 10, 2012

(51) Int. Cl.
*H01L 21/8238* (2006.01)

(52) U.S. Cl. .......... 438/233; 438/300; 438/607

(58) Field of Classification Search .......... 438/233, 438/300, 597, 607, 618, 642, 652, 674, 675; 257/368, 369, 377
See application file for complete search history.

(56) References Cited

U.S. PATENT DOCUMENTS

| | | | |
|---|---|---|---|
| 5,449,637 A * | 9/1995 | Saito et al. .......... 438/227 |
| 7,135,724 B2 | 11/2006 | Chen et al. |
| 7,335,545 B2 | 2/2008 | Currie |
| 7,439,164 B2 | 10/2008 | Langdo et al. |
| 7,625,791 B2 | 12/2009 | Tseng et al. |
| 7,696,036 B2 | 4/2010 | Bu et al. |
| 7,696,517 B2 | 4/2010 | Luan et al. |
| 7,709,902 B2 | 5/2010 | Doris et al. |
| 7,732,872 B2 | 6/2010 | Cheng et al. |
| 7,754,594 B1 | 7/2010 | Chudzik et al. |
| 7,759,748 B2 | 7/2010 | Yu et al. |
| 2006/0054968 A1 | 3/2006 | Lee |
| 2006/0115949 A1 * | 6/2006 | Zhang et al. .......... 438/300 |
| 2006/0220113 A1 * | 10/2006 | Tamura et al. .......... 257/335 |
| 2007/0057324 A1 * | 3/2007 | Tews et al. .......... 257/347 |
| 2007/0090466 A1 * | 4/2007 | Park et al. .......... 257/382 |
| 2008/0070384 A1 | 3/2008 | Murthy et al. |
| 2008/0083948 A1 | 4/2008 | Lin et al. |
| 2008/0217686 A1 | 9/2008 | Majumdar et al. |
| 2008/0293222 A1 | 11/2008 | Chiang et al. |
| 2009/0075029 A1 | 3/2009 | Thomas et al. |
| 2009/0152637 A1 | 6/2009 | Carter et al. |
| 2009/0267149 A1 | 10/2009 | Hua et al. |
| 2009/0325350 A1 * | 12/2009 | Radosavljevic et al. ...... 438/163 |
| 2010/0052066 A1 | 3/2010 | Yu et al. |

* cited by examiner

*Primary Examiner* — Fernando L Toledo
*Assistant Examiner* — Bryan Junge
(74) *Attorney, Agent, or Firm* — Scully, Scott, Murphy & Presser, P.C.; Katherine S. Brown, Esq.

(57) ABSTRACT

An embedded, strained epitaxial semiconductor material, i.e., an embedded stressor element, is formed at the footprint of at least one pre-fabricated field effect transistor that includes at least a patterned gate stack, a source region and a drain region. As a result, the metastability of the embedded, strained epitaxial semiconductor material is preserved and implant and anneal based relaxation mechanisms are avoided since the implants and anneals are performed prior to forming the embedded, strained epitaxial semiconductor material.

15 Claims, 9 Drawing Sheets

STRESSED TRANSISTOR WITH IMPROVED METASTABILITY

BACKGROUND

The present disclosure relates to a semiconductor structure and a method of fabricating the same. More particularly, the present disclosure relates to a semiconductor structure including at least one field effect transistor (FET) having a stressed channel and a metastable embedded, strained epitaxial semiconductor material located at the footprint of the at least one FET.

One trend in modern integrated circuit manufacture is to produce semiconductor devices, such as FETs, which are as small as possible. In a typical FET, a source and a drain are formed in an active region of a semiconductor substrate by implanting n-type or p-type impurities in the semiconductor material. Disposed between the source and the drain is a channel (or body) region. Disposed above the body region is a gate electrode. The gate electrode and the body are spaced apart by a gate dielectric layer.

In order to maintain FET device performance with continued scaling, it has been necessary to use mobility enhancement techniques. One of the most effective and widely used mobility enhancement techniques is referred to as "strained Si". In such a mobility enhancement technique, an embedded SiGe layer (also referred to as eSiGe) is grown with selective epitaxy in the source/drain regions of the device.

Since the introduction of eSiGe, various process and device integration techniques have been introduced to increase the channel strain of the device. The most obvious of these enhancements is to increase the Ge content of the epitaxially grown SiGe layer. Although an eSiGe layer having an increased Ge content can provide enhanced mobility for CMOS devices, increasing the Ge content of an epitaxial grown SiGe layer is filled with difficulty in that any subsequently performed implant or anneal may result in defect formation and strain relaxation within the epitaxially grown SiGe layer.

SUMMARY

In the present disclosure, an embedded, strained epitaxial semiconductor material, i.e., an embedded stressor element, is formed at the footprint of at least one pre-fabricated FET; the pre-fabricated FET includes at least a patterned gate stack, a source region and a drain region. As a result, the metastability of the embedded, strained epitaxial semiconductor material is preserved and implant and anneal based relaxation mechanisms are avoided since the implants and anneals are performed prior to forming the embedded, strained epitaxial semiconductor material.

The terms "metastability" and "metastable" are used throughout the present application to denote a film or films that exist(s) with non-equilibrium strain value, i.e., the strain value of the film is greater than the equilibrium strain value. In some embodiments, the metastable film can be free of defects as well.

In one aspect of the present application, a method of fabricating a semiconductor structure such as a stressed FET is provided. The method includes forming at least one field effect transistor within an active device region of a semiconductor substrate. The at least one field effect transistor that is formed includes a patterned gate stack, a source region and a drain region. A dielectric material is formed on exposed surfaces of the semiconductor substrate and surrounding the at least one field effect transistor. The dielectric material that is formed has at least one set of contact openings that exposes an upper surface of the source region and the drain region. At least a portion of the exposed source region and drain region is removed forming a trench in each of the source region and the drain region. At least each trench in the source region and the drain region is filled with a strained epitaxial semiconductor material.

In another aspect of the present application, a method of fabricating a complementary metal oxide semiconductor (CMOS) structure having stressed FETs of different polarities is provided. The method of forming the (CMOS) structure includes forming a first polarity field effect transistor within a first active device region of a semiconductor substrate and forming a second polarity field effect transistor within a second active device region of the semiconductor substrate, each of the first and second polarity field effect transistors includes a patterned gate stack, a source region and a drain region. A dielectric material is formed on exposed surfaces of the semiconductor substrate and surrounding each of first and second polarity field effect transistors. The dielectric material has at least one first set of contact openings that exposes an upper surface of the source region and the drain region in one of the device regions. At least a portion of the exposed source region and drain region in the one device region is removed forming trenches therein. At least the trenches within the source region and the drain region of the one device region are filled with a first strained epitaxial semiconductor material. A blocking layer is formed on an upper surface of the dielectric material and within the first set of contact openings. A second set of contact openings is formed in the other device region not including the first set of contact openings, wherein the second set of contact openings exposes an upper surface of the source region and the drain region in the other device region. At least a portion of the exposed source region and drain region is removed in the other device region forming trenches therein. At least the trenches in the source region and the drain region of the other device region are filled with a second strained epitaxial semiconductor material.

In yet another aspect of the present disclosure, a semiconductor structure is provided. The semiconductor structure includes at least one field effect transistor located within an active device region of a semiconductor substrate. The at least one field effect transistor includes a patterned gate stack, a source region and a drain region, wherein the source region and the drain region are filled with a metastable strained epitaxial semiconductor material. A dielectric material is located on exposed surfaces of the semiconductor substrate and surrounding the at least one field effect transistor. The dielectric material has contact openings that expose an upper surface of said metastable strained epitaxial semiconductor material. A conductive contact material is located within the contact openings and directly on an upper surface of the metastable strained epitaxial semiconductor material.

DETAILED DESCRIPTION

Figure 1:
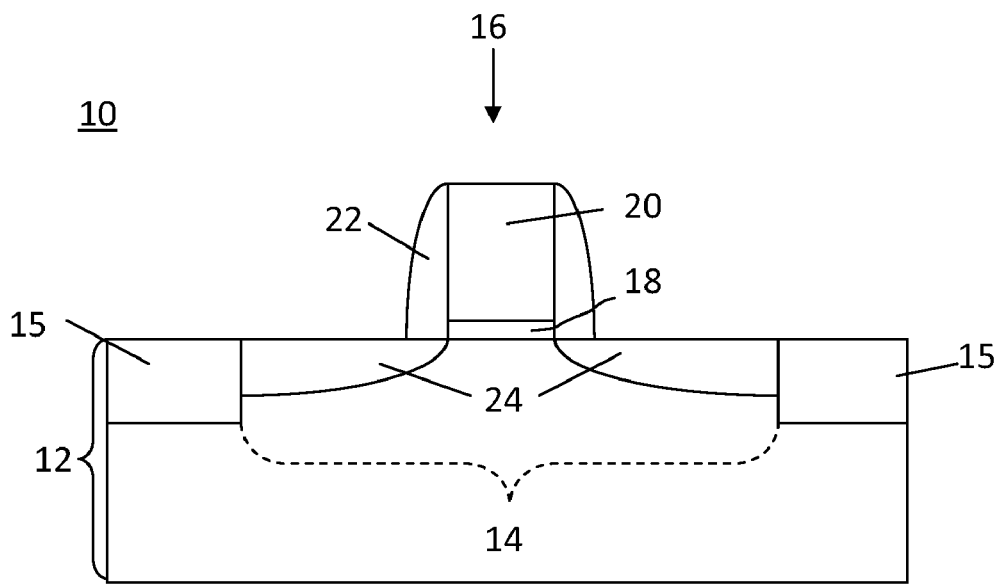
FIG. 1 is a pictorial representation (through a cross sectional view) depicting an initial structure including at least one field effect transistor (FET) located on an active device region of a semiconductor substrate that can be employed in a first embodiment of the present disclosure.

The present disclosure, which provides a semiconductor structure including at least one field effect transistor (FET) having a stressed channel and a metastable embedded strained epitaxial semiconductor material located at the footprint of the at least one FET and a method of fabricating the same, will now be described in greater detail by referring to the following discussion and drawings that accompany the present application. It is noted that the drawings of the present application are provided for illustrative purposes only and, as such, the drawings are not drawn to scale.

In the following description, numerous specific details are set forth, such as particular structures, components, materials, dimensions, processing steps and techniques, in order to provide a understanding of the various embodiment of the present disclosure. However, it will be appreciated by one of ordinary skill in the art that the various embodiments of the present disclosure may be practiced without these specific details. In other instances, well-known structures or processing steps have not been described in detail in order to avoid obscuring the present disclosure.

It will be understood that when an element as a layer, region or substrate is referred to as being "on" or "over" another element, it can be directly on the other element or intervening elements may also be present. In contrast, when an element is referred to as being "directly on" or "directly over" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

Referring first to FIGS. 1-4, there is illustrated a method of forming a transistor including an embedded, strained epitaxial semiconductor material located within the source region and the drain region of at least one transistor, in which the metastability of the epitaxial semiconductor material is preserved. In this embodiment of the present disclosure, the initial structure 10 shown in FIG. 1 can be employed. The initial structure 10 includes a semiconductor substrate 12 having at least one active device region 14 located therein. At least one isolation region 15 can also be located within the semiconductor substrate 12 and surrounding the at least one active device region 14. The initial structure 10 also includes at least one field effect transistor (FET) 16 located upon and within the semiconductor substrate 12. The at least FET includes at a patterned gate stack of at least a gate dielectric 18 and a gate conductor 20. Sidewalls of the patterned gate stack can be covered with at least one sidewall spacer 22. The at least one FET 16 also includes a source region and a drain region, collectively referred to herein as source/drain regions 24, within the semiconductor substrate 12 and at the footprint of the at least one FET 16. The portion of the semiconductor substrate 12 that is located beneath the patterned gate stack and between the source/drain regions 24 is the channel of the at least one FET 16.

The semiconductor substrate 12 illustrated in FIG. 1 can be comprised of any semiconductor material including, but not limited to, Si, Ge, SiGe, SiC, SiGeC, GaAs, GaN, InAs, InP and all other III/V or II/VI compound semiconductors. Semiconductor substrate 12 may also comprise an organic semiconductor or a layered semiconductor such as Si/SiGe, a silicon-on-insulator (SOI), a SiGe-on-insulator (SGOI) or a germanium-on-insulator (GOI). In some embodiments, the semiconductor substrate 12 is composed of a Si-containing semiconductor material, i.e., a semiconductor material that includes silicon. The semiconductor substrate 12 may be doped, undoped or contain doped and undoped regions therein. The semiconductor substrate 12 may include a single crystal orientation or it may include at least two coplanar surface regions that have different crystal orientations (the latter substrate is referred to in the art as a hybrid substrate). When a hybrid substrate is employed, an nFET is typically formed on a (100) crystal surface, while a pFET is typically formed on a (110) crystal plane. The hybrid substrate can be formed by techniques that are well known in the art. See, for example, U.S. Pat. No. 7,329,923, U.S. Publication No. 2005/0116290, dated Jun. 2, 2005 and U.S. Pat. No. 7,023,055, the entire contents of each are incorporated herein by reference.

The semiconductor substrate 12 may also include a first doped (n- or p-) region, and a second doped (n- or p-) region. For clarity, the doped regions are not specifically shown in any of the drawings of the present application. The first doped region and the second doped region may be the same, or they may have different conductivities and/or doping concentrations. These doped regions are known as "wells" and they are formed utilizing conventional ion implantation processes.

At least one isolation region 15 can be typically formed into the semiconductor substrate 12. The at least one isolation region 15 may be a trench isolation region or a field oxide isolation region. The trench isolation region is formed utilizing a conventional trench isolation process well known to those skilled in the art. For example, lithography, etching and filling of the trench with a trench dielectric may be used in forming the trench isolation region. Optionally, a liner may be formed in the trench prior to trench fill, a densification step may be performed after the trench fill and a planarization process may follow the trench fill as well. The field oxide may be formed utilizing a so-called local oxidation of silicon process. Note that the at least one isolation region provides isolation between neighboring gate regions, typically required when the neighboring gates have opposite conductivities, i.e., nFETs and pFETs. The portion of the semiconductor substrate between the at least one isolation region 15 defines an active device region 14 of the semiconductor substrate 12.

After processing the semiconductor substrate 12, the at least one FET 16 is formed within the active device region 14 of the semiconductor substrate 12. The at least one FET 16 can be formed utilizing any conventional process. In one embodiment, the at least one FET 16 can be formed by deposition, lithography and etching. In another embodiment, a replacement gate process can be used in forming that least one FET 16.

As stated above, the at least one FET 16 includes a patterned gate stack including at least a gate dielectric 18 and a gate conductor 20. The gate dielectric 18 of the at least one FET 16 can comprise a dielectric oxide, dielectric nitride, dielectric oxynitride or multilayers thereof. In one embodiment, the gate dielectric 18 includes a semiconductor oxide, a semiconductor nitride or a semiconductor oxynitride. In another embodiment of the present disclosure, the gate dielectric 18 is a high k gate dielectric material having a dielectric constant that is greater than the dielectric constant of silicon oxide, e.g., 3.9. Typically, the high k gate dielectric material that can be employed as gate dielectric 18 has a dielectric constant greater than 4.0, with a dielectric constant of greater than 8.0 being even more typical. Exemplary high k dielectric materials include, but are not limited to, $HfO_2$, $ZrO_2$, $La_2O_3$, $Al_2O_3$, $TiO_2$, $SrTiO_3$, $LaAlO_3$, $Y_2O_3$, $HfO_xN_y$, $ZrO_xN_y$, $La_2O_xN_y$, $Al_2O_xN_y$, $TiO_xN_y$, $SrTiO_xN_y$, $LaAlO_xN_y$, $Y_2O_xN_y$, a silicate thereof, and an alloy thereof. Multilayered stacks of these high k materials can also be employed as the high k gate dielectric 14. Each value of x is independently from 0.5 to 3 and each value of y is independently from 0 to 2.

The thickness of the gate dielectric 18 may vary depending on the technique used to form the same. Typically, however, the gate dielectric 18 has a thickness from 0.5 nm to 10 nm, with a thickness from 1.0 nm to 5 nm being even more typical. In some embodiments, the gate dielectric 18 employed may have an effective oxide thickness on the order of, or less than, 1 nm.

The gate dielectric 18 can be formed by methods well known in the art. In one embodiment, gate dielectric 18 can be formed utilizing a thermal oxidation and/or nitridation process. In another embodiment the gate dielectric 18 can be formed be a deposition method including, for example, chemical vapor deposition (CVD), physical vapor deposition (PVD), molecular beam deposition (MBD), pulsed laser deposition (PLD), liquid source misted chemical deposition (LSMCD), atomic layer deposition (ALD), and other like deposition processes. In some embodiments in which different polarity FETs, e.g., nFETs and pFETs, are formed, the gate dielectric in the different active device regions can be the same or different. Different gate dielectric materials can be formed using block mask technology.

The gate conductor 20 of the patterned gate stack of the at least one FET 16 is located above the gate dielectric 18. The gate conductor 20 that can be employed may comprise any conductive material including, but not limited to, polycrystalline silicon, polycrystalline silicon germanium, an elemental metal (e.g., tungsten, titanium, tantalum, aluminum, nickel, ruthenium, palladium and platinum), an alloy of at least one elemental metal, an elemental metal nitride (e.g., tungsten nitride, aluminum nitride, and titanium nitride), an elemental metal silicide (e.g., tungsten silicide, nickel silicide, and titanium silicide) and multilayers thereof. In one embodiment, the gate conductor 20 can be comprised of a p-type gate metal. In another embodiment, the gate conductor 20 can be comprised of an n-type gate metal. In some instances, a single layer of gate conductor 20 is formed. In another instances, a first layer of conductive material and a second layer of conductive material are formed. In one embodiment, gate conductor 20 may include a stack, from bottom to top, of a conductive metal layer and an upper conductive Si-containing material layer; the conductive metal layer has a higher conductivity than the conductive Si-containing material layer.

The gate conductor 20 can be formed utilizing a conventional deposition process including, for example, chemical vapor deposition (CVD), plasma enhanced chemical vapor deposition (PECVD), evaporation, physical vapor deposition (PVD), sputtering, chemical solution deposition, atomic layer deposition (ALD) and other liked deposition processes. When Si-containing materials are used as the gate conductor 20, the Si-containing materials can be doped within an appropriate impurity by utilizing either an in-situ doping deposition process or by utilizing deposition, followed by a step such as ion implantation in which the appropriate impurity is introduced into the Si-containing material. When a metal silicide is formed, a conventional silicidation process can be employed.

The as deposited gate conductor 20 typically has a thickness from 5 nm to 200 nm, with a thickness from 20 nm to 100 nm being more typical. In some embodiments in which different polarity FETs are formed, the gate conductor material in the different active device regions can be the same or different. Different gate conductive materials can be formed using block mask technology.

In some embodiments, an optional hard mask material (not shown) can be located atop the gate conductor 20. The optional hard mask material includes an oxide, a nitride, an oxynitride or any combination thereof including multilayered stacks. When present, the optional hard mask material is formed utilizing a conventional deposition process well known to those skilled in the art including, for example, CVD and PECVD. Alternatively, the optional hard mask material can be formed by a thermal process such as, for example, oxidation and/or nitridation. The thickness of the optional hard mask material may vary depending on the exact hard mask material employed as well as the process that is used in forming the same. Typically, the hard mask material has a thickness from 5 nm to 200 nm, with a thickness from 10 nm to 50 nm being more typical. The hard mask material is typically employed when the conductive material is a Si-containing material such as polysilicon or SiGe.

Source/drain extension regions (not shown) can be formed utilizing any known extension ion implantation process. After the extension ion implantation, an anneal can be used to activate the implanted extension ions. At least one sidewall spacer 22 can optionally be formed utilizing any known process including deposition of a spacer material, followed by etching. Typical spacer materials include an oxide and/or a nitride. After formation of the spacer, source/drain regions 24 can be formed into the active device region 14 of the semiconductor substrate 12 and at the footprint of the at least one FET 16. In instances in which a replacement gate process is formed, the source/drain regions 24 can be formed prior to forming the patterned gate stack of the at least one FET 16. The source/drain regions 24 can be formed utilizing a source/drain ion implantation process followed by annealing. It is noted that in the drawings of the present disclosure, source/drain regions 24 also include the source/drain extension regions therein.

Figure 2:
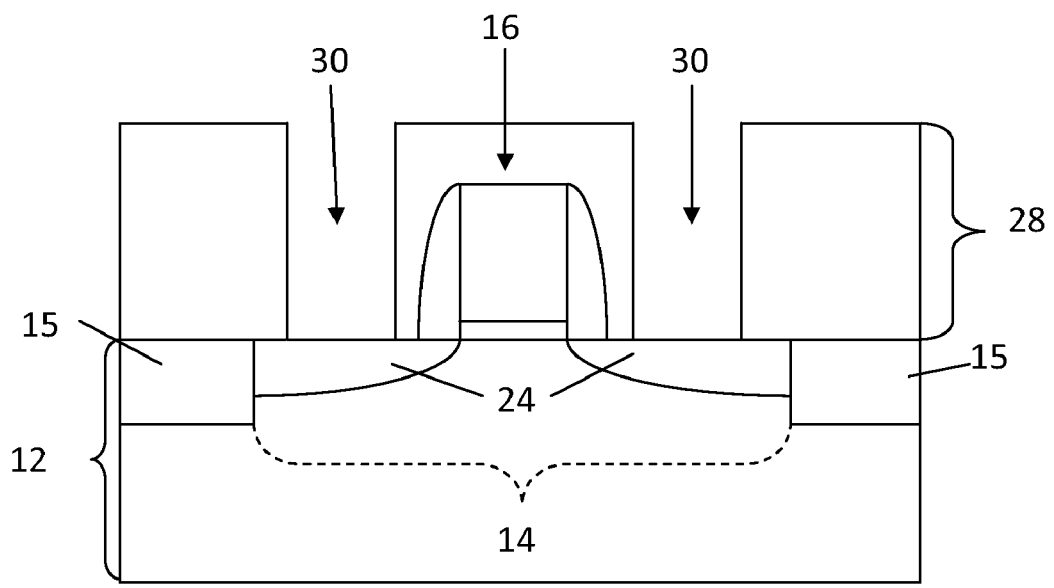
FIG. 2 is a pictorial representation (through a cross sectional view) depicting the initial structure of FIG. 1 after forming a dielectric material having contact holes therein which expose an upper surface of the source region and an upper surface of the drain region of the at least one FET.

Referring now to FIG. 2, there is illustrated the initial structure of FIG. 1 after forming a dielectric material 28 on the exposed portions of the semiconductor substrate 12, atop the at least one isolation region 15, and surrounding the at least one FET 16. The dielectric material 28 has a set of contact openings 30 located therein. Each contact opening 30 extends down to an upper surface of the source/drain regions 24.

The structure shown in FIG. 2 can be formed by first forming a blanket layer of a dielectric material 28 on the exposed portions of the semiconductor substrate 12, atop the at least one isolation region 15, and surrounding the at least one FET 16. The dielectric material 28 can be comprised of any dielectric that is used in middle-of-the line (MOL) or back-end-of the-line (BEOL) applications. The dielectric material 28 may be porous or non-porous. Some examples of suitable dielectrics that can be used as the dielectric material 28 include, but are not limited to, $SiO_2$, a doped or undoped silicate glass, C doped oxides (i.e., organosilicates) that include atoms of Si, C, O and H, silsesquioxanes, thermosetting polyarylene ethers, or multilayers thereof, silicon nitride, silicon oxynitride or any combination, including multilayers thereof. The term "polyarylene" is used in this application to denote aryl moieties or inertly substituted aryl moieties which are linked together by bonds, fused rings, or inert linking groups such as, for example, oxygen, sulfur, sulfone, sulfoxide, carbonyl and the like. In one embodiment, the dielectric material 28 is $SiO_2$ that is formed from tetraethylorthosilane (TEOS) precursor.

The dielectric material 28 can be formed utilizing any conventional deposition process including, but not limited to, spin-on coating, chemical vapor deposition (CVD), plasma enhanced chemical vapor deposition (PECVD), evaporation, and chemical solution deposition.

The dielectric material 28 typically has a dielectric constant of 4.0 or less, with a dielectric constant of 2.8 or less being even more typical. All dielectric constants mentioned in this disclosure are relative to a vacuum, unless otherwise stated. The thickness of the dielectric material 28 is not restrictive so long as the dielectric material 28 covers an upper surface of the patterned gate stack of the at least one FET 16. Typically, the dielectric material 28 has a thickness from 200 nm to 450 nm.

The set of contact openings 30 that is present within the dielectric material 28 can be formed by lithography and etching. The lithographic process includes forming a photoresist (not shown) atop the dielectric material 28, exposing the photoresist to a desired pattern of radiation and developing the exposed photoresist utilizing a conventional resist developer to thereby provide a patterned resist (also not shown) atop the dielectric material 28. The etching process includes a dry etching process (such as, for example, reactive ion etching, ion beam etching, plasma etching or laser ablation), or a wet chemical etching process that selectively removes the exposed portions of dielectric material 28 that are not protected by the patterned resist. Typically, reactive ion etching is used in providing the set of contact openings 30. After etching, the patterned resist is typically removed utilizing a conventional resist stripping process such as, for example, ashing. As shown, each contact opening 30 has sidewalls. The sidewalls within each contact opening 30 may be substantially vertical, as shown, or some tapering may be evident. The set of contact openings 30 can have an aspect ratio that is 1:1 or greater.

Figure 3:
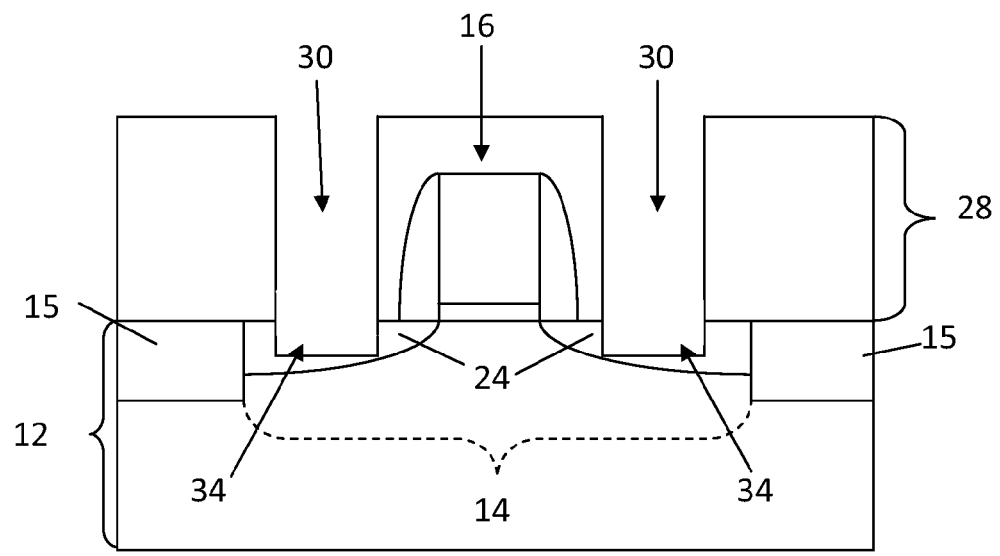
FIG. 3 is a pictorial representation (through a cross sectional view) depicting the structure of FIG. 2 after recessing a portion of the exposed source region and a portion of the exposed drain region forming trenches in the source region and drain region.

Referring to FIG. 3, there is shown the structure of FIG. 2 after recessing a portion of each exposed source/drain region 24 forming trenches 34 therein. The trenches 34, which may also be referred herein as recessed regions, are located within a portion of the previously formed source/drain regions 24. The trenches 34 can be formed by etching the exposed surfaces of the source/drain regions 24 using the dielectric material 28 as an etch mask. The depth of each of the trenches 34, as measured from the top surface of the substrate 12 to the bottom of the trenches 34, is typically from 20 nm to 150 nm, with from 30 nm to 70 nm being more typical.

The etching that can be used in forming each of the trenches 34 includes wet etching, dry etching or a combination of wet and dry etching. In one embodiment, an anisotropic etch can be employed in forming each of the trenches 34. In another embodiment, an isotropic etch can be employed in forming each of the trenches 34. In a further embodiment, a combination of anisotropic etching and isotropic etching can be employed in forming each of the trenches 34. When a dry etch is employed in forming each of the trenches 34, the dry etch can include one of reactive ion etching (RIE), plasma etching, ion beam etching and laser ablation. When a wet etch is employed in forming each of the trenches 34, the wet etch includes any chemical etchant, such as, for example, ammonium hydroxide that selectively etches the exposed portions of the source/drain regions 24. In some embodiments, a crystallographic etching process can be used in forming each of the trenches 34.

In the embodiment illustrated in FIG. 3, the etching provides trenches 34 that have substantially straight sidewalls. The substantially straight sidewalls may have some taper. In an alternative embodiment (not shown), a structure can be formed having faceted trenches. The alternative structure can be formed utilizing a dry etching process, followed by a lateral wet etching process. The lateral wet etch process can include, for example, ammonium hydroxide.

Figure 4:
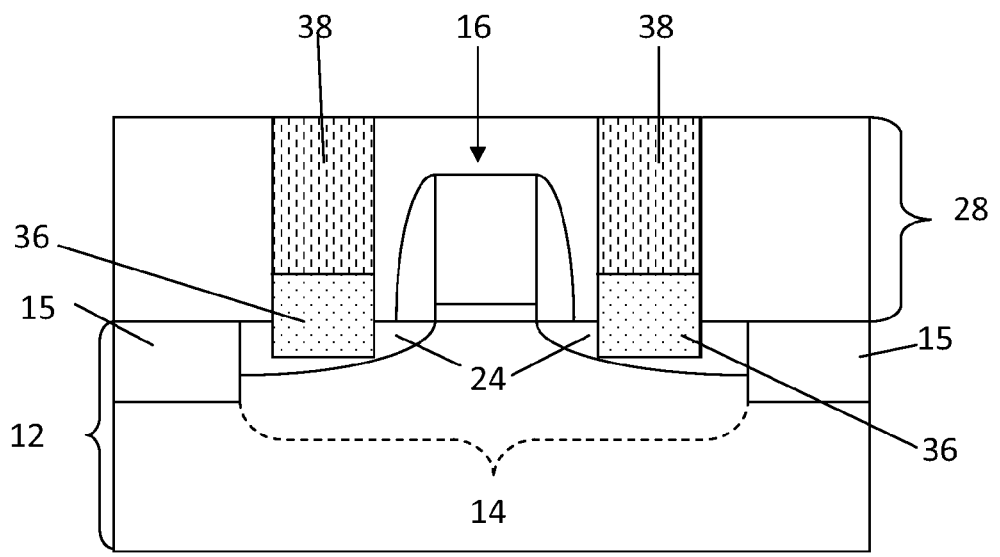
FIG. 4 is a pictorial representation (through a cross sectional view) depicting the structure of FIG. 3 after forming a strained epitaxial semiconductor material within at least the trenches.

Referring now to FIG. 4, there is illustrated the structure of FIG. 3 after forming a strained epitaxial semiconductor material 36 at least within each of the trenches 34. In some embodiments, only the trenches 34 are filled with the strained epitaxial semiconductor material 36. In other embodiments, the entirety of the trenches 34 and a bottom portion of each contact opening 30 include the strained epitaxial semiconductor material 36. It is observed that the strained epitaxial semiconductor material 36 within the trenches 34 represents an embedded stressor element that imparts a strain on the channel of the at least one FET 16.

The strained epitaxial semiconductor material 36 that is formed has a different lattice constant than the lattice constant of the semiconductor substrate 12 and therefore it is capable of enhancing the electron mobility in the device channel by inducing strain to the channel. In one embodiment, and when the semiconductor substrate 12 is composed of silicon and when a pFET gate stack is present, the strained epitaxial semiconductor material 36 can be composed of SiGe or carbon doped silicon germanium (SiGe:C). In another embodiment, and when the semiconductor substrate 12 is composed of silicon and when an nFET gate stack is present, the strained epitaxial semiconductor material 36 can be composed of carbon doped silicon (Si:C).

The strained epitaxial semiconductor material 36 can be formed by any epitaxial growth process that is well known to those skilled in the art. The epitaxial growth ensures that the strained epitaxial semiconductor material 36 has a same crystallographic structure as that of the surface of the semiconductor substrate 12 in which the strained epitaxial semiconductor material 36 is formed. The epitaxial growth process typically employs at least one precursor-containing gas. The types of precursors used in forming the strained epitaxial semiconductor material 36 are well known to those skilled in the art. For example, $SiH_4$ (silane), $SiH_2Cl_2$ (dichlorosilane), $SiHCl_3$ (trichlorosilane), $SiCl_4$ (tetrachlorosilane), $Si_2H_6$ (disilane), $Si_3H_8$ (trisilane), $GeH_4$ (germane), and $SiCH_6$ (monomethylsilane) can be used as precursors of the strained epitaxial semiconductor material 36.

The strained epitaxial semiconductor material 36 that is formed can have a higher concentration of Ge and C than prior art embedded, strained epitaxial semiconductor material that are formed prior to formation of the FET including the source region and drain region. For example, and in one embodiment of the present disclosure in which the strained epitaxial semiconductor material 36 is composed of SiGe, the Ge content can be from 15 atomic % to 60 atomic %. In another embodiment of the present disclosure in which the strained epitaxial semiconductor material 36 is composed of SiGe:C or Si:C, the C content can be from 0.5 atomic % to 3.0 atomic %.

Because the strained epitaxial semiconductor material 36 is formed after formation of the at least one FET 16, the metastability of the strained epitaxial semiconductor material 36 is maintained. Also, because the strained epitaxial semiconductor material 36 is formed after formation of the at least one FET 16, implant and anneal based relaxation are avoided.

The remaining portions of each of the contact openings within dielectric material 28 can be filled with any conductive contact material 38 including, for example, a conductive metal, a conductive metal alloy, a conductive metal nitride, a metal semiconductor alloy, and multilayers thereof. In one embodiment, a metal semiconductor alloy is formed directly on an upper surface of the strained epitaxial semiconductor material 36 and a conductive metal or metal alloy is formed on the metal semiconductor alloy. The filling of the remaining portion of each of the contact openings may include formation of the conductive contact material and planarization. The formation of the conductive contact material 38 may include one of the techniques mentioned above for forming gate conductor 20. The resultant structure including conductive contact material 38 is also shown, for example, in FIG. 4. It is again emphasized that the strained epitaxial semiconductor material 36 is an embedded stressor element that imparts strain to the device channel and as such increase carrier mobility within the device channel.

Figure 5A:
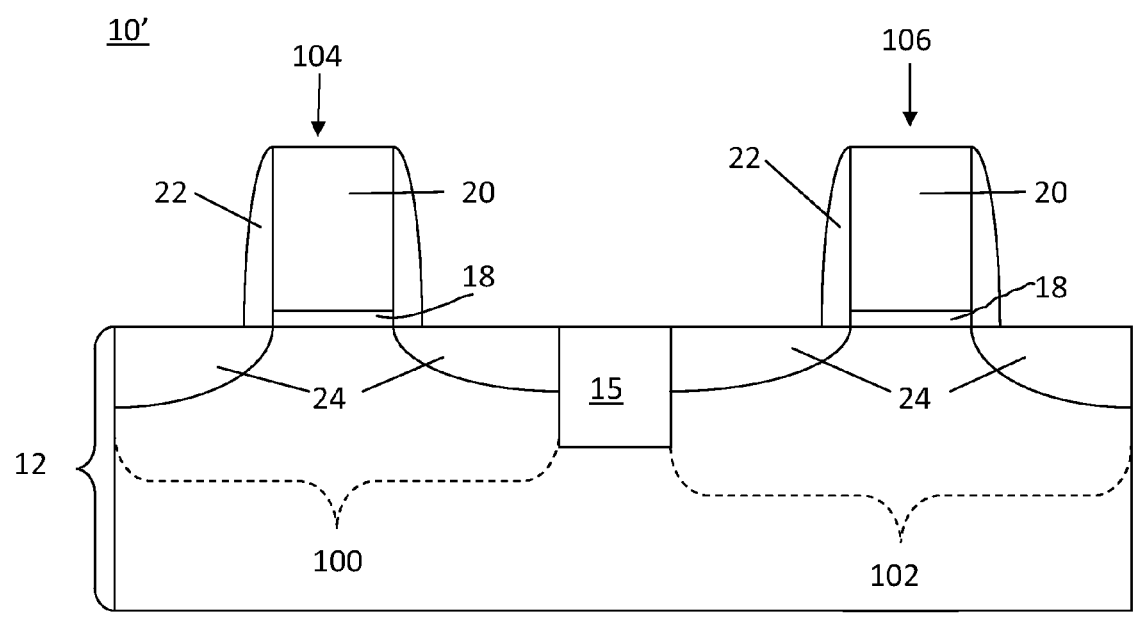
FIGS. 5A-5E are pictorial representations (through cross sectional views) depicting the implementation of the first embodiment described in FIGS. 1-4 for forming a CMOS device including metastable strained epitaxial semiconductor materials embedded within the source region and the drain region of each FET.

Reference is now made to FIGS. 5A-5E, which illustrates a process flow in forming a CMOS structure that employs the basic processing steps described in the embodiment illustrated in FIGS. 1-4. It is noted that in this example of the present disclosure, the initial structure 10' shown in FIG. 5A is employed. The initial structure 10' includes a semiconductor substrate 12 having a first active device region 100 and a second active device 102. The first and second active device regions can be separated by at least one isolation region 15. The first active device region 100, can be either an nFET device region, i.e., an active device region in which an nFET will subsequently be formed, or a pFET device region, i.e., an active device region in which a pFET will subsequently be formed. The second active device region 102 includes the other of the nFET device region or the pFET device region not used as the first active device region 100.

The initial structure 10' also includes a first polarity FET 104 within the first active device region 100 and a second polarity FET 106 within the second active device 102. The first polarity FET 104 may be an nFET or a pFET, while the second polarity FET 106 may be the other of the nFET or pFET not used as the first polarity FET 104.

The first polarity FET 104 and the second polarity FET 106 each includes a patterned gate stack including at least a gate dielectric 18 and a gate conductor 20. The FETs including the gate dielectric and gate conductor employed in this example are formed and/or are composed of the same materials as described above for the initial structure 10 shown in FIG. 1. The patterned gate stacks of the first and second polarity FETs can have the same or different gate dielectric materials and/or gate conductor materials. Different gate dielectric material and gate electrode materials can be obtained utilizing block masks to block formation of one type of material from one active region, while forming the material in another active device region not including the block mask. It is observed that the first polarity FET 104 can be formed before, during or after forming the second polarity FET 106.

The first and second FETs shown in FIG. 5A also include source/drain regions 24 and at least one spacer 22. The source/drain regions 24 can be formed as described above for the initial structure 10 shown in FIG. 1 and the at least one spacer 22 can include materials and by formed as described above for the at least one spacer 22 shown in FIG. 1.

Figure 5B:
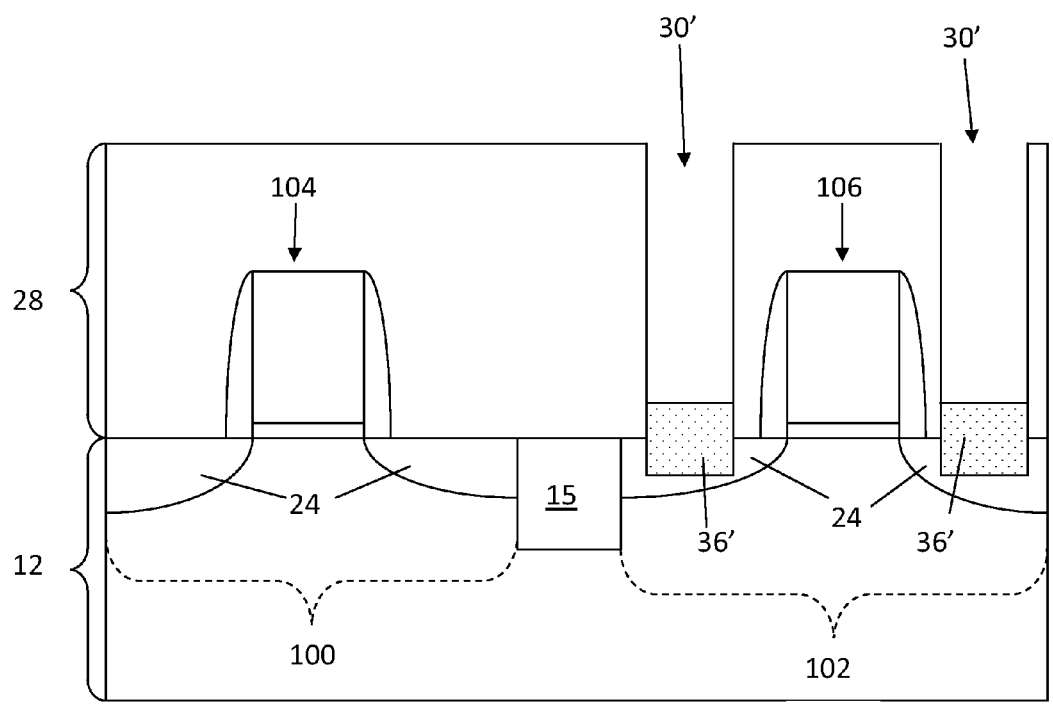

Referring now to FIG. 5B, there is illustrated the initial structure 10' of FIG. 5A after forming dielectric material 28 in both active device regions and forming a first set of contact openings 30' within the dielectric material 28 which exposes the source/drain regions 24 of either the first polarity FET 104 or the second polarity FET 106. In the drawing, the first set of contact openings 30' is formed in the second active device region 102 and thus contact openings 30' expose the source/drain regions 24 of the second polarity FET 106. It is also possible to form the first set of contact openings within the first active device region including the first polarity FET 104. The dielectric material 28 can be comprised of one of the MOL or BEOL dielectrics mentioned above for dielectric material 28 shown in FIG. 2. Dielectric material 28 can also be formed and have a thickness as mentioned above. The first set of contact openings 30' can also be formed as described above for the set of contact openings 30.

After forming the first set of contact openings 30', portions of the exposed source/drain regions in the specific active device region are removed providing a first set of trenches (not specifically shown 5B). The removal of portions of the exposed source/drain regions 24 utilizes one of the etching techniques mentioned above for forming trenches 34. FIG. 5B also shows the formation of a first strained epitaxial semiconductor material 36' at least within the first set of trenches. The first strained epitaxial semiconductor material 36' is formed by using the same technique as mentioned above for strained epitaxial semiconductor material 36. The first strained epitaxial semiconductor material 36' also includes one of the materials mentioned above for strained epitaxial semiconductor material 36. The type of epitaxial semiconductor material formed within the first set of trenches is dependent on the polarity of the FET. For example, when a pFET gate stack is present, the first strained epitaxial semiconductor material 36' can be composed of SiGe or SiGe:C. When an nFET gate stack is present, the first strained epitaxial semiconductor material 36' can be Si:C.

Figure 5C:
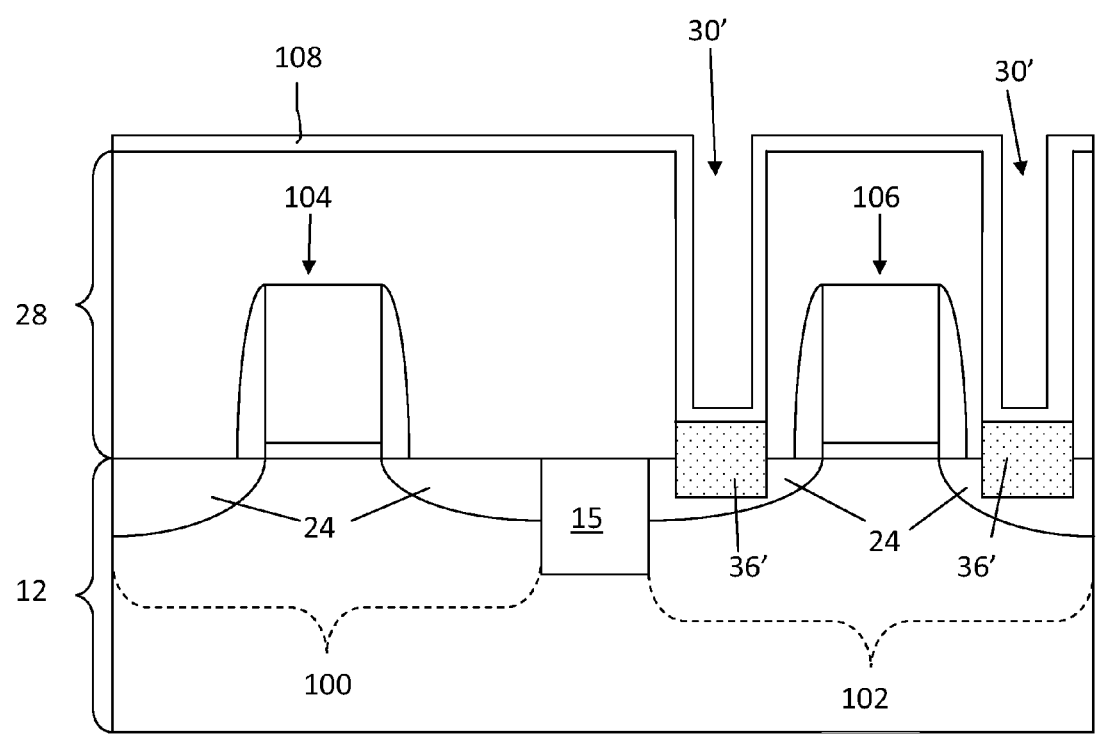

Referring now to FIG. 5C, there is shown the structure of FIG. 5B after forming a blocking layer 108 on the upper surface of the dielectric material 28, on exposed sidewalls of the dielectric material 28 within the first set of contact openings 30' and on an upper surface of the first strained epitaxial semiconductor material 36'. The blocking layer 108 can be comprised of an oxide, nitride and/or oxynitride. In one embodiment, the blocking layer 108 can be comprised of silicon oxide. In another embodiment, the blocking layer 108 can be comprised of silicon nitride. The blocking layer 108 can be formed utilizing any conventional deposition process including, but not limited to, chemical vapor deposition and physical vapor deposition. The thickness of the blocking layer 108 may vary. In some embodiments, the blocking layer 108 can be subjected to planarization after the deposition of the blocking material.

Figure 5D:
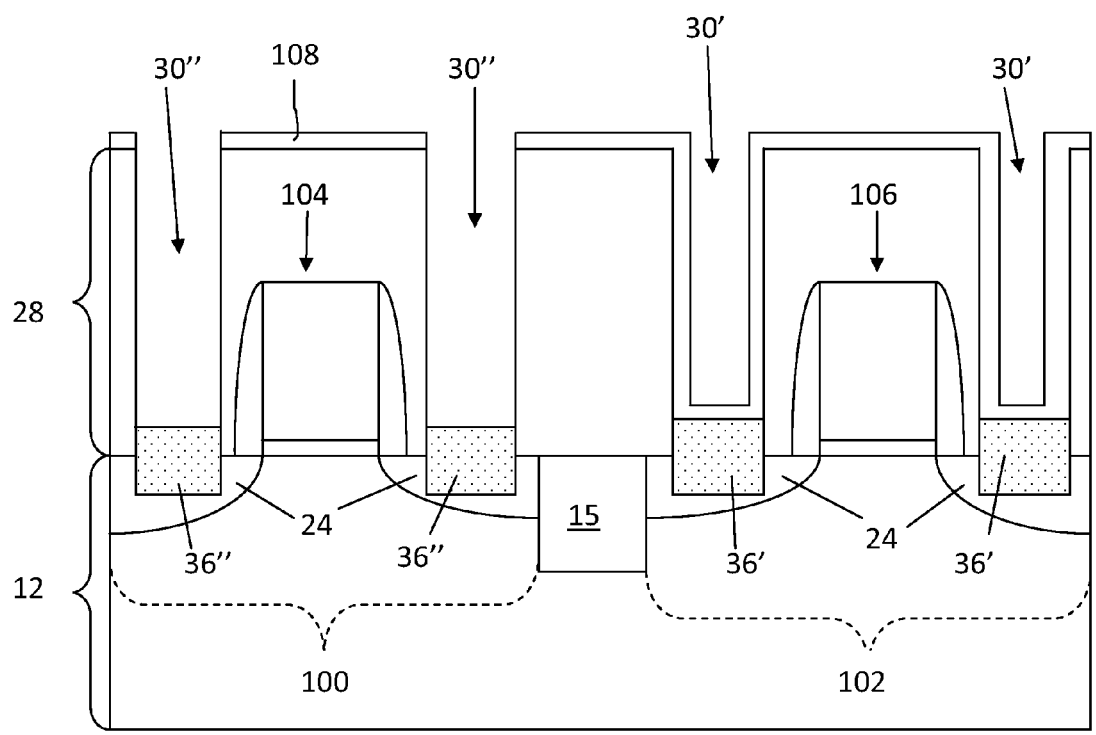

Referring now to FIG. 5D, there is illustrated the structure of FIG. 5C after forming a second set of contact openings 30" in the active device region not including the first set of contact openings 30'. In the drawing, the first active device region 100 including the first polarity FET 104 is processed to include the second set of contact openings 30". The second set of contact openings 30" is formed utilizing one of the techniques mentioned above for forming contact openings 30.

A second set of trenches (not specifically shown) is formed within the exposed source/drain regions 24 within the active device region including the second set of contact openings 30" and a second strained epitaxial semiconductor material 36" as shown in FIG. 5D is formed within the second set of trenches. The second strained epitaxial semiconductor material 36" induces a different type of strain than the first strained epitaxial semiconductor material 36'. The second set of trenches can be formed utilizing one of the etching techniques mentioned above for forming trenches 34. The second strained epitaxial semiconductor material 36" is formed utilizing epitaxial growth, as mentioned above for material 36, and the material of the second epitaxial semiconductor material 36" that is formed within the second set of trenches is dependent on the polarity of the FET. For example, when a pFET gate stack is present, the second strained epitaxial semiconductor material 36" can be composed of SiGe or SiGe:C. When an nFET gate stack is present, the second strained epitaxial semiconductor material 36" can be Si:C. It is further noted that the first strained epitaxial semiconductor material 36' and the second strained semiconductor material 36" are composed of different epitaxial semiconductor materials which can induce different types of stress to the FET channel within the different active device regions.

Figure 5E:
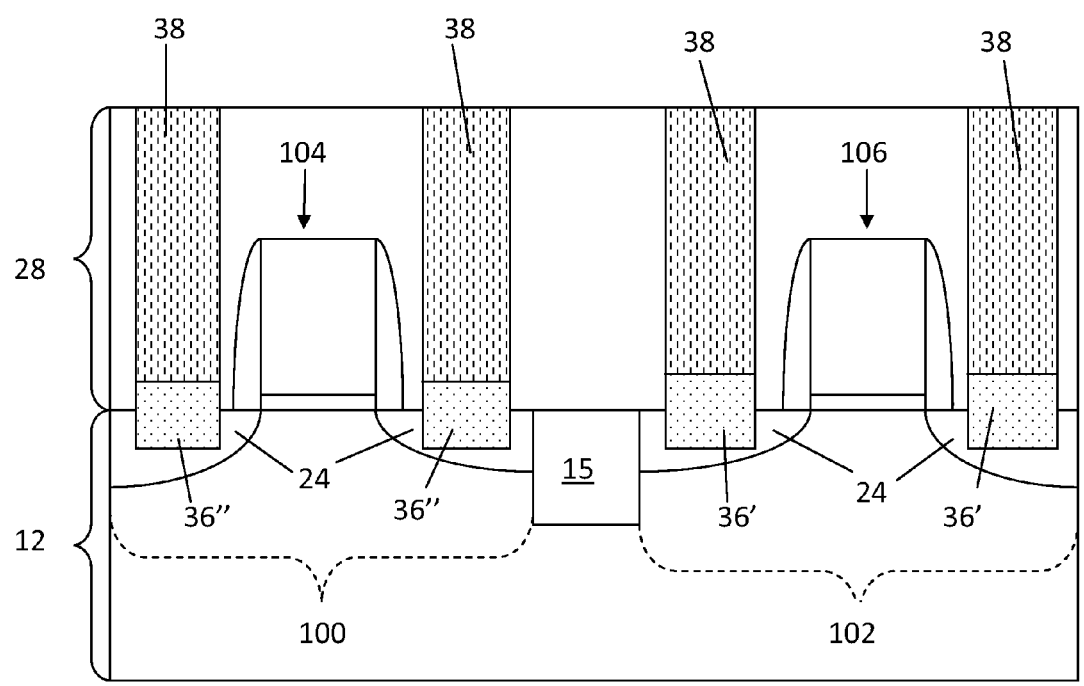

Referring now to FIG. 5E, there is illustrated the structure of FIG. 5D after removing the block layer 108 from the structure and filling the remaining portions of the first and second set of contact openings with conductive contact material 38. The removal of the block layer is performed by utilizing a chemical wet etch process, and the conductive contact material 38 is formed as described above.

Reference is now made to FIGS. 6-10 which illustrate a method in accordance with a second embodiment of the present disclosure. The second embodiment begins by providing the initial structure 150 shown in FIG. 6. Initial structure 150 is identical to the initial structure 10 shown in FIG. 1 except that a sacrificial embedded, epitaxial semiconductor material 152 is within the source/drain regions 24 of the at least one FET 16. The initial structure 150 minus the sacrificial embedded, epitaxial semiconductor material 152 is comprised of materials that are the same as that shown in FIG. 1, and it is formed utilizing the same techniques as mentioned above in forming initial structure 10. The sacrificial embedded, epitaxial semiconductor material 152 is formed by recessing selective portions of the source/drain regions 24 and filling the recessed regions with a sacrificial epitaxial semiconductor material. The sacrificial embedded, epitaxial semiconductor material 152 can be a strained material layer. The recessed regions are formed after forming the FET 16 by utilizing an etching technique that is well known to those skilled in the art. The at least one FET 16, and if present, the at least one sidewall spacer 22 serve as an etch mask during the etching process. The etching process selectively removes exposed portions of the semiconductor substrate 12 that are not protected by the at least one FET 16 and, if present, the at least one sidewall spacer 22. The depth of each of the recessed regions, as measured from the top surface of the substrate 12 to the bottom of the recessed region 30, is typically from 20 nm to 150 nm, with from 30 nm to 70 nm being more typical. The etching that can be used in forming each of the recessed regions includes one of the etching techniques mentioned above in forming trenches 36.

The sacrificial embedded, epitaxial semiconductor material 152 can be formed by utilizing any conventional epitaxial growth process and the sacrificial embedded, epitaxial semiconductor material 152 is composed of one of the epitaxial semiconductor materials mentioned above for strained epitaxial semiconductor material 36. For example, the sacrificial embedded, epitaxial semiconductor material 152 can be comprised of SiGe, SiGe:C, or Si:C.

Figure 6:
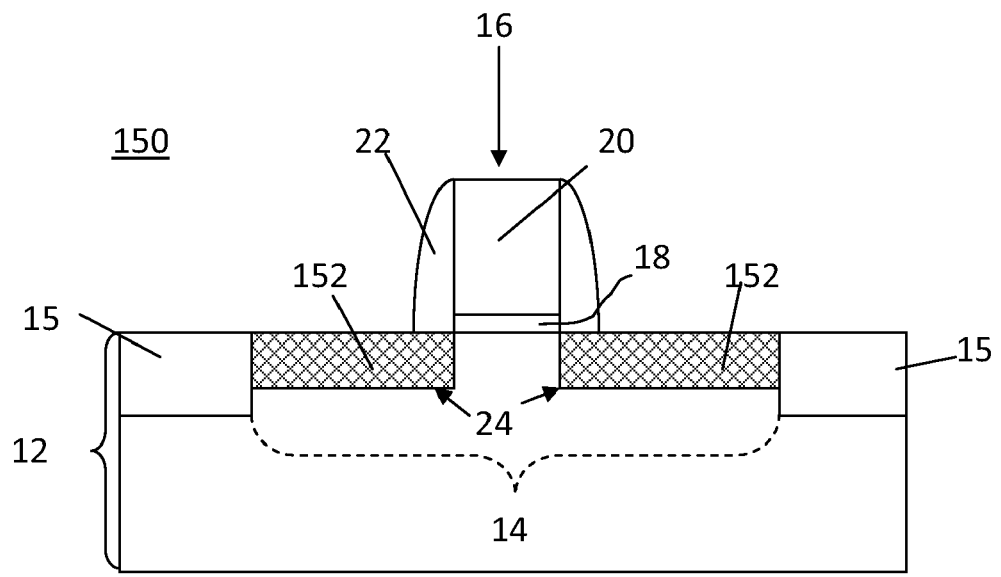
FIG. 6 is a pictorial representation (through a cross sectional view) depicting an initial structure including at least one FET located in an active device region of a semiconductor substrate, and a sacrificial epitaxial semiconductor material embedded within the source region and the drain region of the at least one FET in accordance with a second embodiment of the present disclosure.
Figure 7:
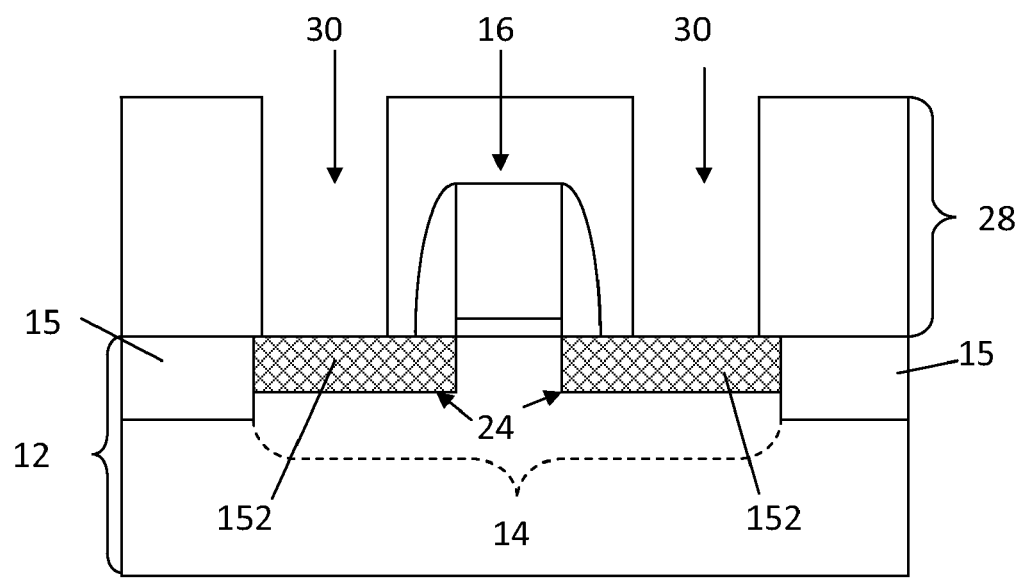
FIG. 7 is a pictorial representation (through a cross sectional view) depicting the initial structure of FIG. 6 after forming a dielectric material having contact holes therein which expose an upper surface of the sacrificial epitaxial semiconductor material embedded within the source region and the drain region of the at least one FET.

Referring now to FIG. 7, there is illustrated the initial structure of FIG. 6 after forming a dielectric material 28 having a set of contact openings 30 therein. The dielectric material 28 is comprised of, and is formed as mentioned above in regard to the structure shown in FIG. 2. Likewise, the set of contact openings 30 is formed as described above in regard to the structure shown in FIG. 2. In this embodiment of the present application, the set of contact openings 30 exposes an upper surface of a portion of the sacrificial embedded, epitaxial semiconductor material 152.

Figure 8:
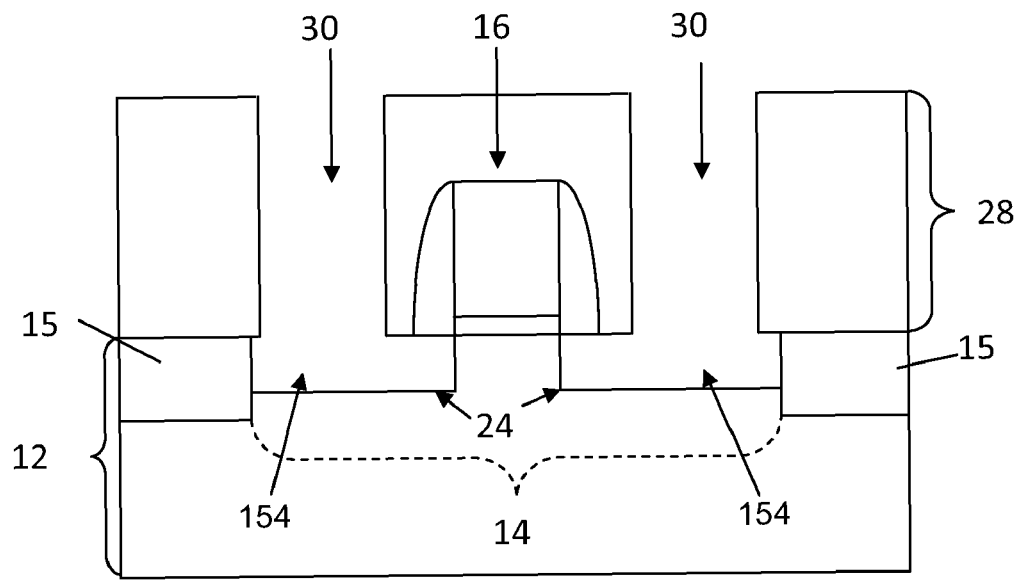
FIG. 8 is a pictorial representation (through a cross sectional view) depicting the structure of FIG. 7 after removing the sacrificial epitaxial semiconductor material from the structure.

Referring now to FIG. 8, there is illustrated the structure of FIG. 7 after removing the entity of the sacrificial embedded, epitaxial semiconductor material 152 from the structure using the dielectric material 28 as an etch mask. In this embodiment, the etch employed selectively removes the sacrificial embedded, epitaxial semiconductor material 152 relative to the dielectric material 28, isolation region 15 and the semiconductor substrate 12. In one embodiment, a gas-phase HCl etch performed in the epitaxial reactor can be employed to remove the entirety of the sacrificial embedded, epitaxial semiconductor material 152. The removal of the sacrificial embedded, epitaxial semiconductor material 152 from the structure provides trenches 154 in the source/drain region 24 of the structure. In this embodiment, trenches 154 can extend beneath the at least one sidewall spacer 22 and are aligned with the FET 16 instead of the contact opening 30.

Figure 9:
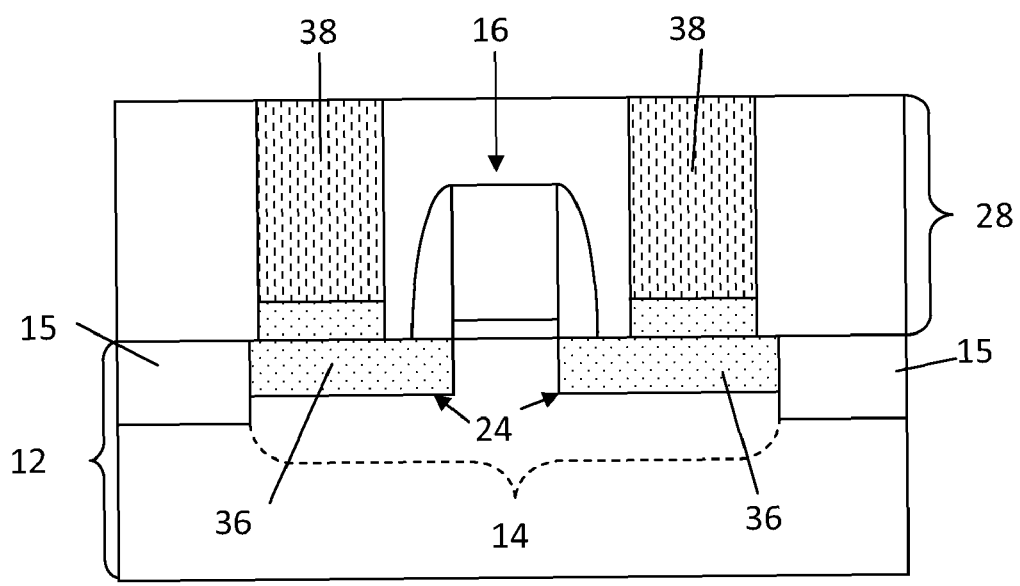
FIG. 9 is a pictorial representation (through a cross sectional view) depicting the structure of FIG. 8 after forming a strained epitaxial semiconductor material at least within the areas of the semiconductor substrate previously occupied by the sacrificial epitaxial semiconductor material.

Referring now to FIG. 9, there is illustrated the structure of FIG. 8 after forming a strained epitaxial semiconductor material 36 at least within each of the trenches 154. The strained epitaxial semiconductor material 36 includes materials, and can be formed, as described above in the first embodiment of the present disclosure. The structure shown in FIG. 9 also includes conductive contact material 38 atop the strained epitaxial semiconductor material 36. The conductive contact material 38 includes one of the conductive materials, and can be formed as described above in the first embodiment of the present disclosure.

Although the second embodiment illustrated in FIGS. 6-9 includes a single FET, the basic processing steps of the second embodiment can also be employed in forming a stressed CMOS device. Such a process would include forming sacrificial embedded, epitaxial semiconductor layers at the footprint of each FET into the initial structure shown in FIG. 5A. The basic processing flow shown in FIGS. 5B-5E would follow except that the sacrificial embedded epitaxial semiconductor material would need to be removed as described above in the second embodiment prior to forming the 'new' strained epitaxial semiconductor material within recessed regions previously occupied by the sacrificial embedded, epitaxial semiconductor material.

While the present disclosure has been particularly shown and described with respect to preferred embodiments thereof, it will be understood by those skilled in the art that the foregoing and other changes in forms and details may be made without departing from the spirit and scope of the present disclosure. It is therefore intended that the present disclosure not be limited to the exact forms and details described and illustrated, but fall within the scope of the appended claims.

What is claimed is:

1. A method of fabricating a semiconductor structure comprising:
    forming at least one field effect transistor within an active device region of a semiconductor substrate, said at least one field effect transistor including a patterned gate stack, a source region and a drain region, and wherein said forming the at least one field effect transistor includes recessing the source region and the drain region, and filling the recessed source region and drain region with a sacrificial epitaxial semiconductor material;
    forming a dielectric material on exposed surfaces of said semiconductor substrate and surrounding the at least one field effect transistor, said dielectric material having at least one set of contact openings that exposes an upper surface of the source region and the drain region;
    completely removing said sacrificial epitaxial semiconductor material from said source region and drain region forming a trench in each of the source region and the drain region; and
    filling at least the trench in the source region and the drain region with a strained epitaxial semiconductor material.

2. The method of claim 1 wherein said completely removing said sacrificial epitaxial semiconductor material includes a gas phase HCl etch.

3. The method of claim 2 wherein said gas phase HCl etch is performed in an epitaxial reactor.

4. The method of claim 1 wherein said filling the trench within the source region and the drain region with said strained epitaxial semiconductor material includes an epitaxial growth method.

5. The method of claim 4 wherein said epitaxial growth method includes growing SiGe, SiGe:C or Si:C.

6. The method of claim 1 further comprising forming a conductive contact material directly on a surface of said strained epitaxial semiconductor material.

7. The method of claim 6 wherein said forming the conductive contact material includes forming a metal semiconductor alloy directly on an upper surface of the strained epitaxial semiconductor material, and forming another conductive material atop the metal semiconductor alloy.

8. The method of claim 1 wherein said filling the trench within the source region and the drain region includes also fills a lower portion of each contact opening with said epitaxial strained semiconductor material.

9. The method of claim 1 wherein said trench in said source region and said drain region extends beneath at least one spacer present on a sidewall of said at least one field effect transistor.

10. A method of forming a complementary metal oxide semiconductor structure comprising:
    forming a first polarity field effect transistor within a first active device region of a semiconductor substrate and forming a second polarity field effect transistor within a second active device region of said semiconductor substrate, each of said first and second polarity field effect transistors includes a patterned gate stack, a source region and a drain region, wherein said forming said first polarity field effect transistor and second polarity field effect transistor includes recessing the source region and the drain region, and filling the recessed source region and drain region with a sacrificial epitaxial semiconductor material;
    forming a dielectric material on exposed surfaces of said semiconductor substrate and surrounding the first and second polarity field effect transistors, said dielectric material having at least one first set of contact openings that exposes an upper surface of the source region and the drain region in one of said device regions;
    completely removing said sacrificial epitaxial semiconductor material from source region and drain region in said one device region forming trenches therein;
    filling at least said trenches within the source region and the drain region of the one device region with a first strained epitaxial semiconductor material;
    forming a blocking layer on an upper surface of said dielectric material and within said first set of contact openings;
    forming a second set of contact openings in the other device region not including the first set of contact openings, wherein said second set of contact openings exposes an upper surface of the source region and the drain region in the other device region;
    completely removing said sacrificial epitaxial semiconductor material from source region and drain region in said other device region forming trenches therein; and
    filling at least said trenches in the source region and the drain region of the other device region with a second strained epitaxial semiconductor material.

11. The method of claim 10 wherein said first polarity field effect transistor is a pFET and said first strained epitaxial semiconductor material is composed of SiGe or SiGe:C, and said second polarity field effect transistor is an nFET and said second strained epitaxial semiconductor material is composed of Si:C.

12. The method of claim 10 further comprising forming a conductive contact material directly on a surface of said first and second strained epitaxial semiconductor materials.

13. The method of claim 10 wherein said completely removing said sacrificial epitaxial semiconductor material from each device region includes a gas phase HCl etch.

14. The method of claim 13 wherein said gas phase HCl etch is performed in an epitaxial reactor.

15. The method of claim 10 wherein said trenches in said source region and said drain region in both device regions extend beneath at least one spacer present on a sidewall of each of said first polarity field effect transistor and said second polarity field effect transistor.

* * * * *